United States Patent [19]
Lee

[11] Patent Number: 5,674,406
[45] Date of Patent: Oct. 7, 1997

[54] STOPPER MANUFACTURING METHOD OF A SILICON MICROMACHINING STRUCTURE

[75] Inventor: Jong-Hyun Lee, Taegu, Rep. of Korea

[73] Assignees: Kyungpook National University Sensor Technology Research Center; Mando Machinery Corporation, both of Rep. of Korea

[21] Appl. No.: 332,839

[22] Filed: Nov. 1, 1994

[30] Foreign Application Priority Data

Nov. 2, 1993 [KR] Rep. of Korea ............... 1993-23136

[51] Int. Cl.$^6$ .................... H01L 21/00; B44C 1/22
[52] U.S. Cl. ................... 216/2; 216/99; 156/628.1; 156/657.1; 156/662.1
[58] Field of Search ..................... 216/2, 41, 55, 216/99; 156/628.1, 657.1, 659.11, 662.1; 437/927

[56] References Cited

U.S. PATENT DOCUMENTS

| | | | |
|---|---|---|---|
| 4,581,624 | 4/1986 | O'Connor | 216/2 X |
| 4,808,549 | 2/1989 | Mikkor et al. | 216/2 X |

*Primary Examiner*—William Powell
*Attorney, Agent, or Firm*—Irving Keschner

[57] ABSTRACT

A stopper manufacturing method of a silicon micromachining structure comprising steps of growing an oxidized film on a n-type substrate; opening a $n^+$-diffusion window by the photo-lithography through first selective diffusion and forming a $n^+$-diffusion region using n-type impurity sources; forming a $n^+$diffusion region by the depth 0.5 to 5 μm on the portion subject to form a stopper through the secondary diffusion; removing the oxidized film and growing a n-type silicon epitaxial layer on the front surface of the substrate; etching the n-type silicon epitaxial layer, selectively, exposing the $n^+$-layer and depositing a porous silicon layer in HF solution by the anodic reaction; and etching the porous silicon layer away in etching solution to form a microstructure, thereby preventing the side etching and the breaking down of the microstructure by the exterior shock.

5 Claims, 5 Drawing Sheets

(DIFFUSION AND EPITAXIAL LAYER GROWTH)

(DEFINITION OF MICROSTRUCTURE)

(ANODIC REACTION)

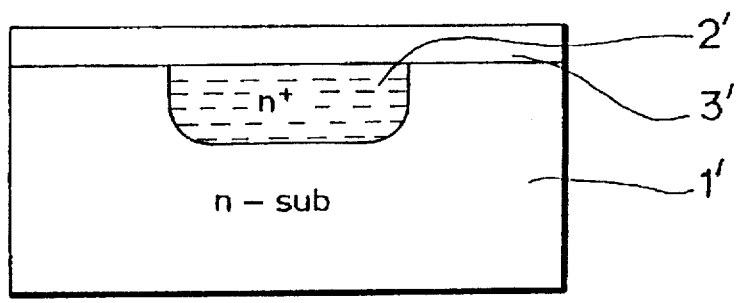
FIG. 2a (SELECTIVE DIFFUSION AND EPITAXIAL LAYER GROWTH)
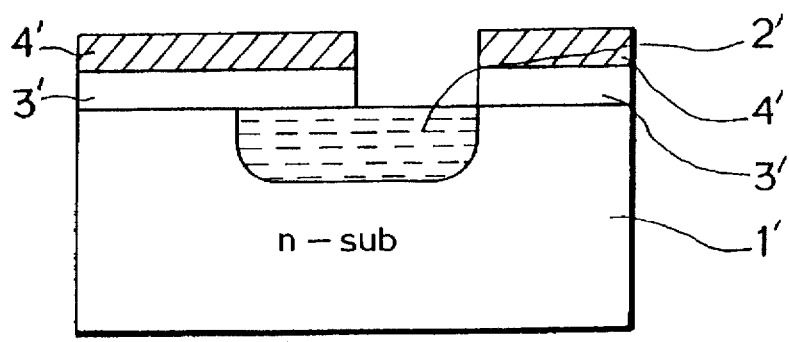
FIG. 2b (DEFINITION OF MICROSTRUCTURE)
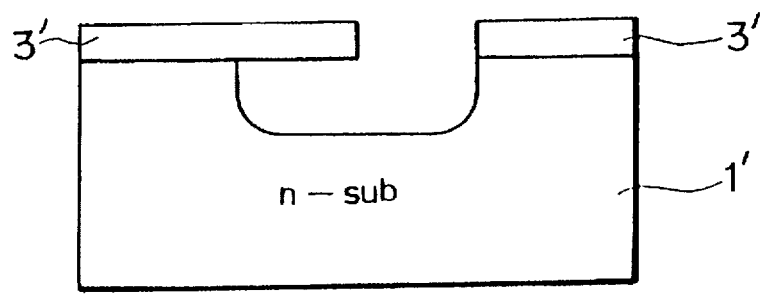
FIG. 2c (ANODIC REACTION)

(OXIDATION)

(FIRST DIFFUSION)

(SECONDARY DIFFUSION)

(EPITAXIAL LAYER GROWTH)

(ANODIC REACTION)

(PSL ETCHING)

STOPPER MANUFACTURING METHOD OF A SILICON MICROMACHINING STRUCTURE

BACKGROUND OF THE INVENTION

The invention is related to providing a method for manufacturing a stopper followed by the side etching prevention and the dual diffusion of various semiconductors in forming the micromachining structure, and in particular, to providing a stopper manufacturing method of a silicon micromachining structure for manufacturing a stopper for the adaption in use of the buffing action of a microstructure accompanying with the prevention of the side etching, the control of the diffusion depth and the performance of the diffusion at two steps around the selective diffusion.

In general, a method for manufacturing the microstructure of semiconductor elements is to form the microstructure by which a silicon sample having three-floor structure of $n/n^+/n$ is processed in HF (Hydrogen Fluoride) solution by the anodic-reaction. In other words, a $n^+$-diffused layer 2' and a n-epitaxial layer 3' are first placed on a n-type substrate 1' as shown in FIG. 1, a. A silicon oxidation film ($SiO_2$) 4' is deposited on the n-epitaxial layer 3', a photoresist is set by the photo-masking thereon and the n-epitaxial layer 3' and the silicon oxidation film 4' are in part etched by the photo-lithography as shown in FIG. 1, b. Next, the residual silicon oxidation film 4' is removed, while the resulting substrate is anodic-reacted in HF solution to form the microstructure.

But, according to the method for forming the microstructure of the semiconductor element it is difficult to define the side of the microstructure, because the $n^+$-diffused layer 2' exists under the bottom portion of the n-epitaxial layer 3' as shown in FIG. 1, a. That is, it has a problem in that the side surface of the micro-structure is etched onto the undesired part to be under-cut. The microstructure has a serious effect on the products if it is used for the microstructure of a vibration or acceleration sensor.

Thus, it is preferable to precisely control the side-etching in the formation of the microstructure.

The object of the invention is to provide a stopper manufacturing method of a silicon micromachining structure for manufacturing a stopper for the adaption in use of the buffing action of a microstructure following that only the desired portion is selectively diffused in order to prevent the side-etching, the diffusion depth is controlled to define the under-cutting portion, and the two-step diffusion is performed in forming the microstructure.

The other object of the invention is to provide a stopper manufacturing method of a silicon micromachining structure for manufacturing a stopper which the side-etching is prevented by diffusion control.

SUMMARY OF THE INVENTION

In order to accomplish these objectives and characteristics, according to the invention, a stopper manufacturing method of a silicon micromachining structure comprises steps of oxidizing various semiconductors, diffusing it twice, growing the epitaxial layer, performing the anodic-reaction in a HF solution and etching it.

BRIEF DESCRIPTION OF THE DRAWINGS

The invention now will be described in detail with reference, to the accompanying drawings, in which:

FIGS. 2, a to c are views illustrating a method for forming a microstructure of a semiconductor element which the side-etching is prevented by the selective diffusion according to the invention;

DETAILED DESCRIPTION OF THE INVENTION

Referring to FIG. 2, a method for forming a microstructure of a semiconductor element of which the side-etching is prevented by the selective diffusion are as follows:

Firstly, a $n^+$-diffused layer 2' and a n-epitaxial layer 3' are placed in order on a n-type substrate 1' by the selective diffusion and the epitaxial growth as shown in FIG. 2, a. A silicon oxidation film ($SiO_2$) 4' is deposited on the n-epitaxial layer 3', a photoresist is set by the photo-masking thereon and the n-epitaxial layer 3' and the silicon oxidation film 4' are in part etched by the photo-lithography to define a microstructure as shown in FIG. 2, b. Next, the residual silicon oxidation film 4' is removed, while the resulting substrate is anodic-reacted in HF solution to form the microstructure. Thus, only the portion to be constituted as an air gap is selectively etched by the anodic-reaction to prevent the side-etching which is desired.

Figure 1A:
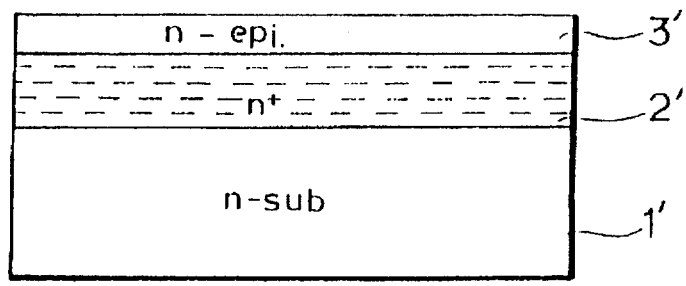
FIGS. 1, a to c are views illustrating a conventional method for forming a microstructure of a semiconductor element using the anodic reaction in a HF solution.
Figure 1B:
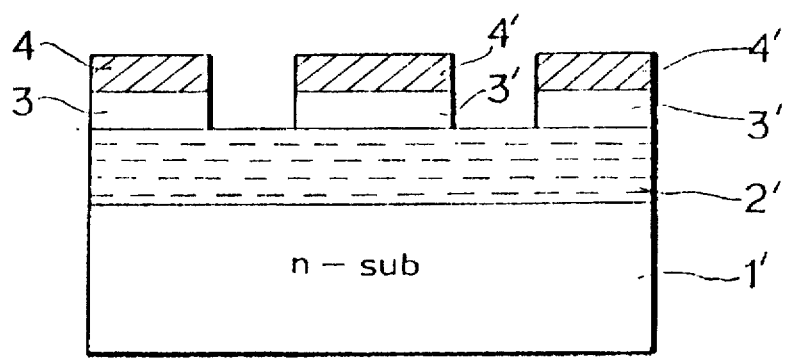
Figure 1C:
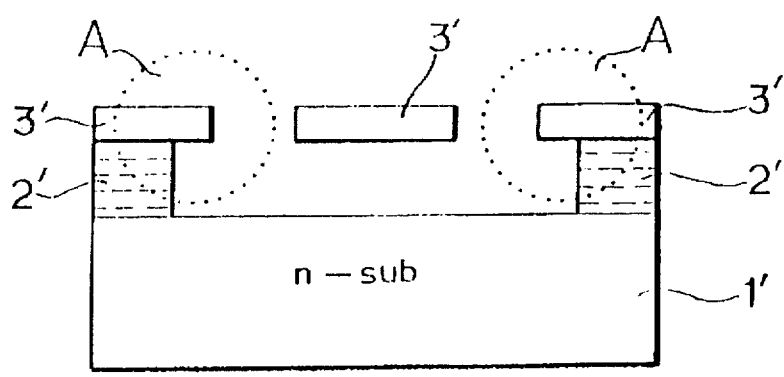
Figure 3A:
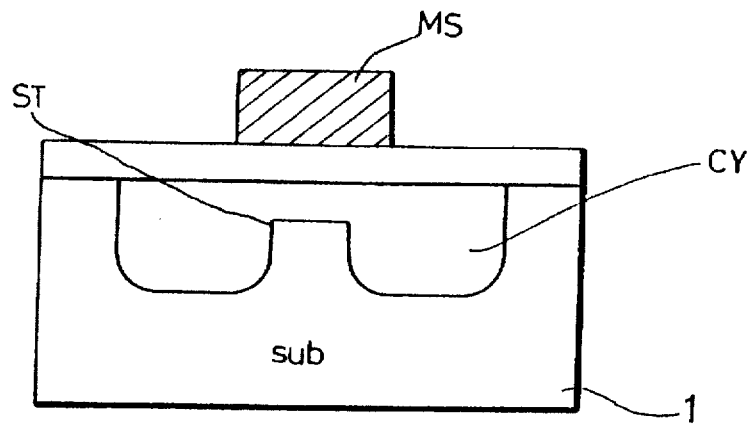
FIGS. 3, a and b are cross sectional views illustrating a semiconductor element having a microstructure which a stopper is made.
Figure 3B:
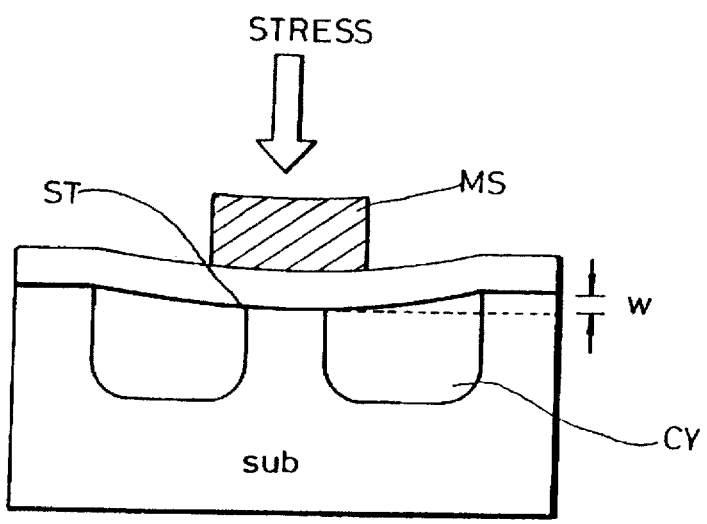
Figure 4A:
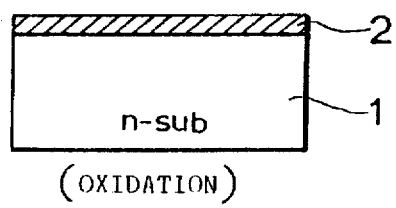
FIGS. 4, a to f are views illustrating a method for manufacturing a stopper of a silicon micromachining structure which the side-etching is prevented by the diffusion control according to the invention.
Figure 4B:
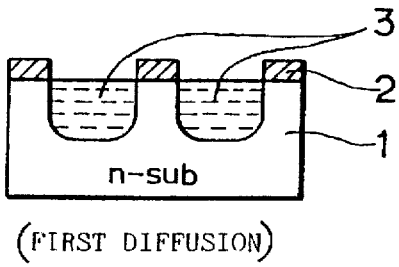
Figure 4C:
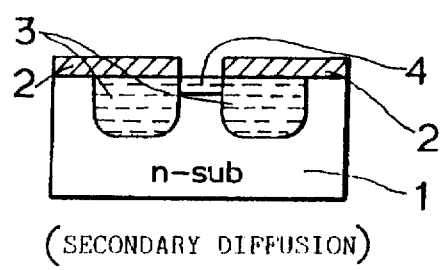
Figure 4D:
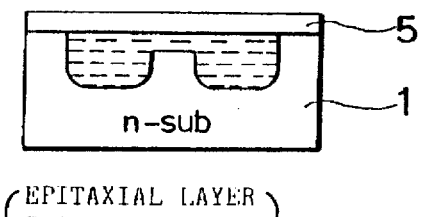
Figure 4E:
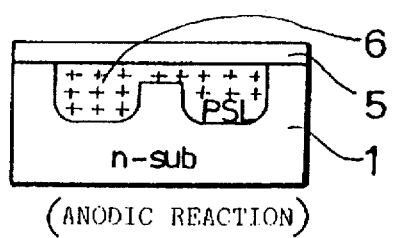
Figure 4F:
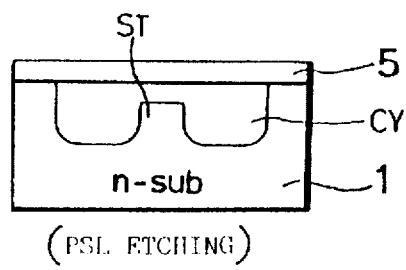

FIG. 3 is the cross sectional view of a semiconductor element having a microstructure in order to represent the configuration and function of a stopper, in which FIG. 3, a shows the semiconductor element to which the exterior stress is not applied, and FIG. 3, b shows the semiconductor element to which the exterior stress is applied. The semiconductor element, comprises a substrate 1, a cavity CY, a stopper ST and a mass MS. The stopper St enables a microstructure for supporting a predetermined size of the mass MS to control the maximum width W which is bent by the exterior stress. The stopper ST does the buffing action to prevent the breaking down of the microstructure due to the strong shock.

Referring to FIG. 4, a method for manufacturing a stopper is as follows: An oxidized film 2 is grown by the thickness of 4,500–5,500 A° on a n-type substrate 1 as shown in FIG. 4, a (the oxidation procedure). Next, a $n^+$diffusion window is opened by the photo-lithography to perform the first selective diffusion, and a $n^+$-diffusion region 3 is formed by the depth of 5 to 20 μm using n-type impurity sources such as P, As, Sb as shown in FIG. 4, b (first diffusion procedure). Also, a $n^+$ diffusion region 4 is formed by the depth 0.5 to 5 μm on the portion subject to form a stopper through the secondary diffusion as shown in FIG. 4, c (the secondary diffusion procedure). The oxidized film 2 is removed, while a n-type silicon epitaxial layer 5 having the resistivity of 9.5 to 10.5 Ωm is grown by the thickness of 5 to 15 μm on the front surface of the substrate 1 as shown in FIG. 4, d (the epitaxial layer growing procedure). Then, the n-type silicon epitaxial layer 5 is selectively etched by the thickness of 5.5 to 15 μm to expose the n$^+$-layer, and a porous silicon layer 6 (referred to as PSL below) is deposited in a HF solution (5-48 wt %) by the anodic reaction under the reaction voltage of 2-5 V for a time period of 10-30 minutes as shown in FIG. 4., e (the anodic reaction procedure). The PLS 6 is etched away in NaOH solution of 4.5-5.5 wt % to form the microstructure as shown in FIG. 4. f (the PSL etching procedure).

Figure 5A:
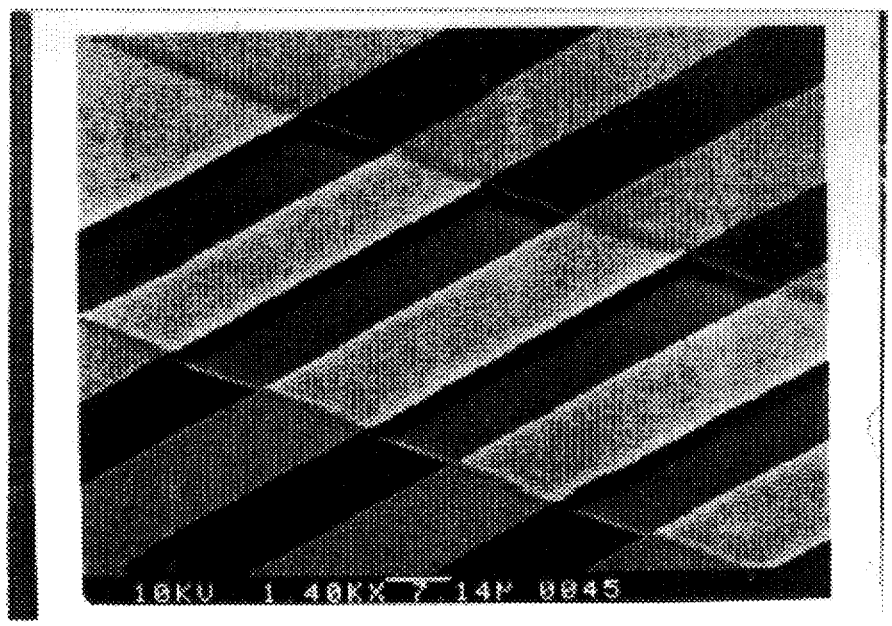
FIGS. 5, a and b are photographs illustrating the cross-section of a bridge-type of microstructure having a stopper, in which figure a is a photograph of a microstructure enlarged by 1400 times using a surface enlargement microscope, and FIG. b is a photograph illustrating the cross-section of the microstructure ground slant at 10 degree and enlarged by 7,000 times.
Figure 5B:
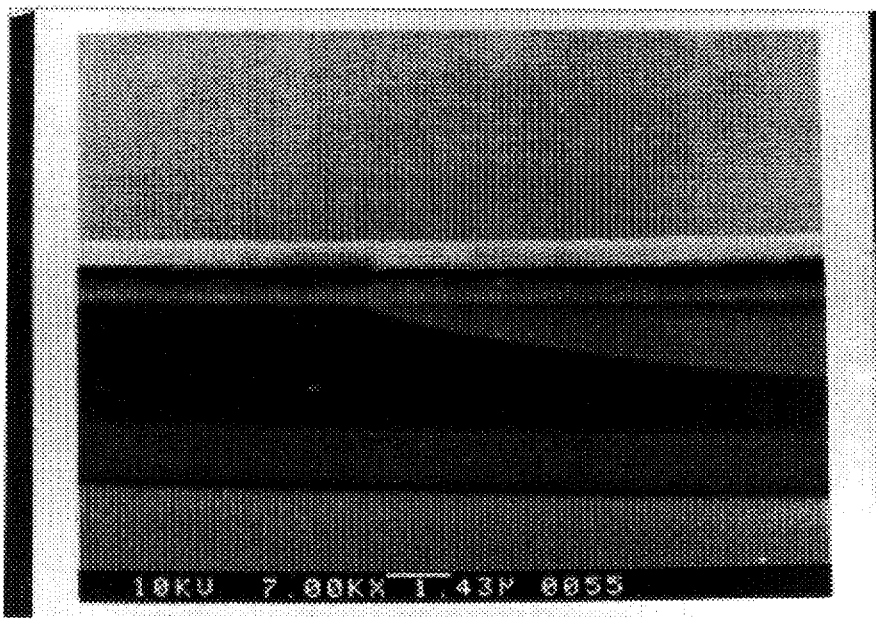

Thus, referring to FIG. 5, it is noted from FIG. 5, a that the n$^+$ diffusion region 4 defined through a two-step selective diffusion is processed by the anodic reaction, whereby the PSL is clearly etched away. It is known from FIG. 5, b that an air gap is formed between the bridge-type microstructure and the stopper by 1 μm.

As described above, a stopper manufacturing method of the invention enables only the desired portion to be diffused. Thus, the invention has advantages in that the side-etching is prevented as well as the breaking down of the microstructure that is caused by the exterior shock is prevented.

Also, the invention is adapted to an acceleration or pressure sensor that acts as a stopper below a motion sensing part which causes its stress in proportion to the acceleration or weight of a moving body. Thus, it can control the maximum width W which is bent by the exterior force playing important roles in the response characteristic of the acceleration or pressure sensor, thereby preventing the breaking down of the acceleration or pressure sensor and enhancing reliability of the products.

What is claimed is:

1. A stopper manufacturing method of a silicon micromachining structure comprising steps of:

growing an oxidized film on a n-type substrate;

opening a n$^+$-diffusion window by the photo-lithography through first selective diffusion and forming a n$^+$-diffusion region using n-type impurity sources;

forming a n$^+$ diffusion region by the depth 0.5 to 5 μm on the portion subject to form a stopper through the secondary diffusion;

removing the oxidized film and growing a n-type silicon epitaxial layer on the front surface of the substrate;

etching the n-type silicon epitaxial layer, selectively, exposing the n$^+$-layer and depositing a porous silicon layer in HF solution by the anodic reaction; and, etching the porous silicon layer away in etching solution to form a microstructure, thereby preventing the side-etching and the breaking down of the microstructure by the exterior shock.

2. The stopper manufacturing method of a silicon micromachining structure as claimed in claim 1, in which:

the n$^+$-diffusion region is formed by the depth of 5 to 20 μm through first diffusion procedure.

3. The stopper manufacturing method of a silicon micromachining structure as claimed in claim 1, in which:

the n-type silicon epitaxial layer has the resistivity of 9.5 to 10.5 Ωm and the thickness of 5 to 15 μm through the epitaxial layer growing procedure.

4. The stopper manufacturing method of a silicon micromachining structure as claimed in claim 1, in which:

the anodic reaction is performed in HF solution of 5-48 wt% under the reaction voltage of 2-5 V for a time period of 10-30 minutes.

5. The stopper manufacturing method of a silicon micromachining structure as claimed in claim 1, in which:

the etching solution is NaOH solution of 4.5-5.5 wt % used in the PSL etching procedure.

* * * * *